United States Patent
Kiyono et al.

(10) Patent No.: US 9,530,746 B2
(45) Date of Patent: Dec. 27, 2016

(54) CHIP MOUNTING STRUCTURE AND MANUFACTURING METHOD THEREFOR

(71) Applicant: International Business Machines Corporation, Armonk, NY (US)

(72) Inventors: Satsuo Kiyono, Yokohama (JP); Eiji Ohno, Yamato (JP); Masahiro Uemura, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/595,687

(22) Filed: Jan. 13, 2015

(65) Prior Publication Data
US 2015/0214175 A1   Jul. 30, 2015

(30) Foreign Application Priority Data
Jan. 27, 2014   (JP) ................................. 2014-012141

(51) Int. Cl.
*H01L 23/48* (2006.01)
*H01L 23/00* (2006.01)

(52) U.S. Cl.
CPC ............... *H01L 24/17* (2013.01); *H01L 24/09* (2013.01); *H01L 24/11* (2013.01); *H01L 24/81* (2013.01);
(Continued)

(58) Field of Classification Search
CPC .................. H01L 2924/00; H01L 2924/00014; H01L 2224/16225; H01L 2224/32225; H01L 2224/73204; H01L 2924/15311; H01L 2224/48091; H01L 2924/10253; H01L 2924/01029; H01L 2924/01033; H01L 2924/01047; H01L 24/17; H01L 24/09; H01L 24/11; H01L 24/81; H01L 2224/0401; H01L 2224/095; H01L 24/03
(Continued)

(56) References Cited

U.S. PATENT DOCUMENTS

| 8,039,384 | B2* | 10/2011 | Pagaila | H01L 24/03 257/E21.499 |
| 8,492,197 | B2* | 7/2013 | Cho | H01L 21/4857 438/108 |
| 8,563,418 | B2* | 10/2013 | Pagaila | H01L 24/03 257/E21.508 |

FOREIGN PATENT DOCUMENTS

| JP | 08111432 A | 4/1996 |
| JP | 2000299562 A | 10/2000 |

(Continued)

OTHER PUBLICATIONS

Kiyono et al., "Chip Mounting Structure and Manufacturing Method Therefor", Japanese patent application No. 2014-012141 filed on Jan. 27, 2014.

*Primary Examiner* — Tod T Van Roy
*Assistant Examiner* — Vu A Vu
(74) *Attorney, Agent, or Firm* — Scully, Scott, Murphy & Presser, P.C.; Damion Josephs, Esq.

(57) ABSTRACT

Chip mounting is provided in which the pitch between bumps can be further narrowed without establishing contact between bumps. In a chip mounting structure in which a flip-chip bond has been established between a chip and a board via bumps, the bumps are provided so that the height position of the bumps from the connection surface of the chip or the connection surface of the board has a difference in height exceeding the thickness of adjacent bumps. This
(Continued)

further narrows the pitch between bumps without establishing contact between the bumps.

7 Claims, 9 Drawing Sheets

(52) U.S. Cl.
CPC .. *H01L 2224/0401* (2013.01); *H01L 2224/095* (2013.01)

(58) Field of Classification Search
USPC .......................................... 257/737; 438/108
See application file for complete search history.

(56) References Cited

FOREIGN PATENT DOCUMENTS

| | | | |
|---|---|---|---|
| JP | 2003142624 A | 5/2003 | |
| JP | 2003218273 A | 7/2003 | |
| JP | 2004228103 A | 8/2004 | |
| JP | 2006049930 A | 2/2006 | |
| JP | 2006114741 A | 4/2006 | |

\* cited by examiner

CHIP MOUNTING STRUCTURE AND MANUFACTURING METHOD THEREFOR

BACKGROUND OF THE INVENTION

The present invention relates to a mounting technology for integrated circuit (IC) chips (hereinafter "chips") and, more specifically, to a chip mounting structure and manufacturing method for a chip mounting structure in which the pitch (interval) between bumps has been narrowed in a flip-chip connection.

Bumps, such as solder bumps, are used in a flip-chip connection between a semiconductor chip and the board supporting the chip. These bumps are arranged in an array on the connection surface of the chip at a pitch, for example, from 150 µm to 200 µm.

Japanese Patent Publication Number 08-111432 (Application Number 06-246469) discloses a semiconductor device in which the positions of wide pads are alternately shifted in the lead connections between a semiconductor chip and the resin package surrounding it and the leads are arranged on the resin package so that the pads do not establish contact between each other.

Japanese Patent Publication Number 2006-114741 (Application Number 2004-301385) discloses a multi-layer core board in which tapered via hole conductors extending into the multi-layer core board through a cladding layer in insulated spots to a power supply layer, and tapered via-hole conductors extending through the power supply layer in insulated spots to the cladding layer are arranged in alternating fashion so as to narrow the pitch between via holes.

SUMMARY

Embodiments of the present invention provide a chip mounting structure establishing a flip-chip interconnect between the chip and a board via bumps, in which the height positions of adjacent bumps from the connection surface of the chip or the connection surface of the board have a difference exceeding the thickness of the bumps.

Embodiments of the present invention provide a chip mounting structure. Pillars of a predetermined height that is greater than the thickness of a bump are arranged at each flip-chip interconnect position, alternating between the connection surface of the chip and the connection surface of the board. In one example, pillars are positioned on the board at even positions and on the chip at odd positions. A bump is formed on each pillar. In another embodiment, a bump is also provided at flip-chip interconnect positions between pillars.

Embodiments of the present invention provide a method for manufacturing a chip mounting structure, in which the method includes the steps of: forming a pillar of a predetermined height greater than the thickness of the bumps on the connection surface of the chip at every other flip-chip interconnect position; forming a bump on each pillar formed on the connection surface of the chip; forming a pillar of the predetermined height on the connection surface of the board at every other flip-chip interconnect position different from those on the connection surface of the chip; forming a bump on each pillar formed on the connection surface of the board; and connecting the bumps formed on pillars of the chip to the board at flip-chip interconnect positions on the connection surface of the board not including a bump, and connecting the bumps formed on pillars of the board to the chip at flip-chip interconnect positions on the connection surface of the chip not including a bump.

Embodiments of the present invention provide a method for manufacturing a chip mounting structure, in which the method includes the steps of: forming a pillar of a predetermined height greater than the thickness of the bumps on the connection surface of the chip at every other flip-chip interconnect position; forming a bump on each pillar formed on the connection surface of the chip and at each flip-chip interconnect position between the pillars; forming a pillar of the predetermined height on the connection surface of the board at every other flip-chip interconnect position different from those on the connection surface of the chip; and connecting the bumps formed on pillars and at flip-chip interconnect positions between pillars on the connection surface of the chip to pillars formed on the connection surface of the board and to flip-chip interconnect positions on the connection surface of the board not including a bump.

Another aspect of the present invention is a method for manufacturing a chip mounting structure, in which the method includes the steps of: forming a pillar of a predetermined height greater than the thickness of the bumps on the connection surface of the chip at every other flip-chip interconnect position; forming a pillar of the predetermined height on the connection surface of the board at every other flip-chip interconnect position different from those on the connection surface of the chip; forming a bump on each pillar formed on the connection surface of the board and at each flip-chip interconnect position between the pillars; and connecting the bumps formed on the pillars and at flip-chip interconnect positions between pillars on the connection surface of the board to pillars formed on the connection surface of the chip and to flip-chip interconnect positions on the connection surface of the chip not including a bump.

DETAILED DESCRIPTION

Embodiments of the present invention recognize that the pitch between bumps may be narrowed only two dimensionally, in the X and Y directions. As a result, it is difficult to further narrow the pitch between bumps without establishing contact between bumps and causing electrical shorts. Embodiments of the present invention provide for mounting chips in such a way that the pitch between bumps can be narrowed without establishing contact between bumps by a chip mounting structure and a manufacturing method for the chip mounting structure described herein.

Embodiments of the present invention provide chip mounting in which the pitch between bumps can be narrowed without establishing contact between the bumps. Embodiments provide a chip mounting structure and a manufacturing method for the chip mounting structure in which the pitch between bumps can be narrowed in a flip-chip connection.

Embodiments of the present invention provide for further narrowing the pitch between bumps. The arrangement of bumps is taken into account not only in the X-direction and the Y-direction on a two-dimensional plane but also in the Z-direction orthogonal to this plane. A three-dimensional arrangement is provided in the X-direction, the Y-direction and the Z-direction by alternatingly changing the height position (i.e., position in the Z-axis) of bumps so that adjacent bumps do not have the same height position.

Figure 1A:
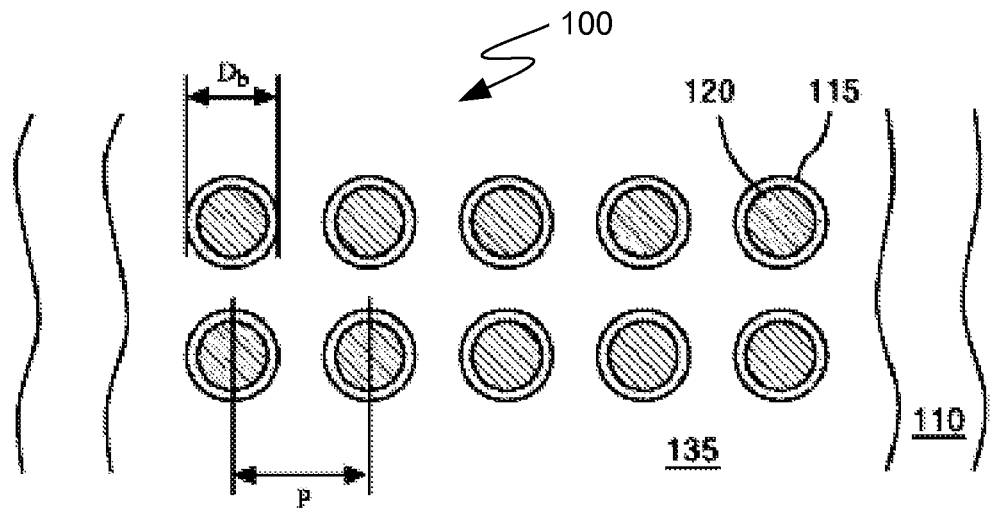
FIG. 1A is a top view of an arrangement of bumps and pillars in a flip-chip connection of the prior art.

The following is an explanation of the present invention with reference to embodiments of the present invention. However, any preferred embodiment does not limit the present invention in the scope of the claims. Also, all combinations of characteristics explained in various embodiments are not necessarily required in each implementation of embodiments of the present invention. The present invention can be embodied in many different ways and should not be interpreted as being limited in any way by the description of the preferred embodiment. As used herein, identical structures and components are denoted by the same reference numbers. However, for clarity of illustration, redundant reference numbers may be omitted in the figures. For example, FIG. 1A depicts multiple pillars 120 but only one such pillar is identified by a reference number. It is understood that, in such cases, the reference numbers refer to all similar structures.

FIG. 1A is a top view of the arrangement of bumps 115 and copper (Cu) pillars 120 on a connection surface 110 of a board 105 in which the chip 125 and the pads 145 on the chip 125 have been omitted. The pitch P is obtained with reference to the diameter Db of the bumps 115.

Figure 1B:
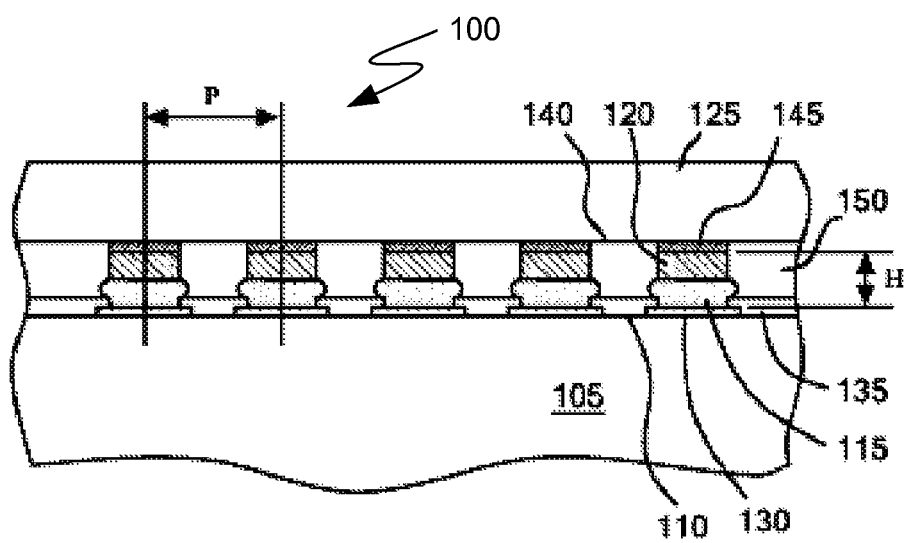
FIG. 1B is a cross-sectional side view of a chip mounting structure with a flip-chip connection of the prior art.

FIG. 1B is a cross-sectional side view of a chip mounting structure 100 in which the chip 125 has been connected to the board 105 via the bumps 115 using a flip-chip connection. The bumps 115 are arranged on top of metal (e.g., aluminum (Al), copper (Cu)) pads 130 on the connection surface 110 of the board 105. The bumps 115 and the pads 130 are surrounded by an insulating layer 135. Insulating layer 135 may be, for example, a solder mask. Similarly, pillars 120 are arranged on top of metal pads 145 on the connection surface 140 of the chip 125. An underfill 150 is provided between the insulating layer 135 on the board 105 and the connection surface 140 of the chip 125. The height of the pillars 120 and the thickness of the bumps 115 is established so that the distance between the pads 130 on the board 105 and the pads 145 on the chip 125 is H.

Figure 2:
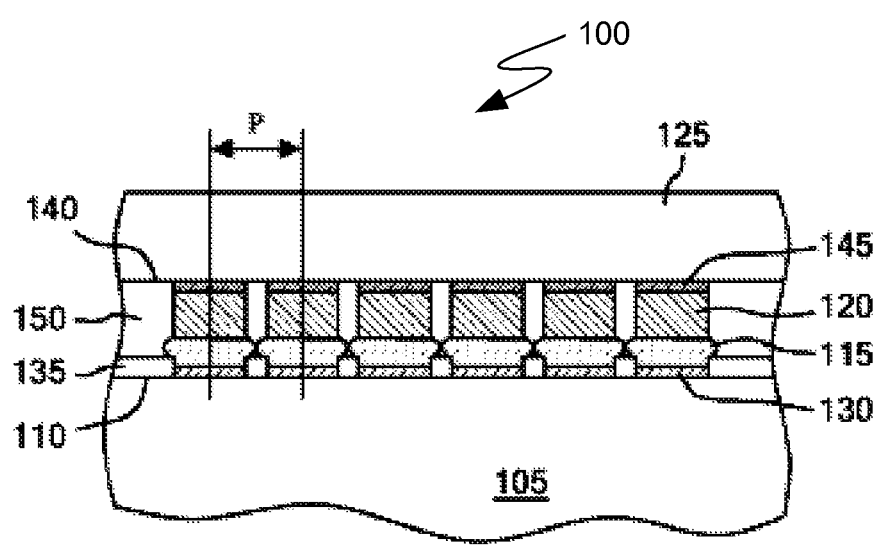
FIG. 2 is a cross-sectional side view of a chip mounting structure with a flip-chip connection of the prior art in which the pitch between bumps has been narrowed.

As the circuits on chips 125 become more integrated, there is a need for even narrower pitches P between the bumps 115. However, as shown in FIG. 2, the central portion of bumps 115 bulge outward and, when the pitch P is narrowed between bumps 115, contact is established between adjacent bumps 115, resulting in electrical shorts.

Figure 3A:
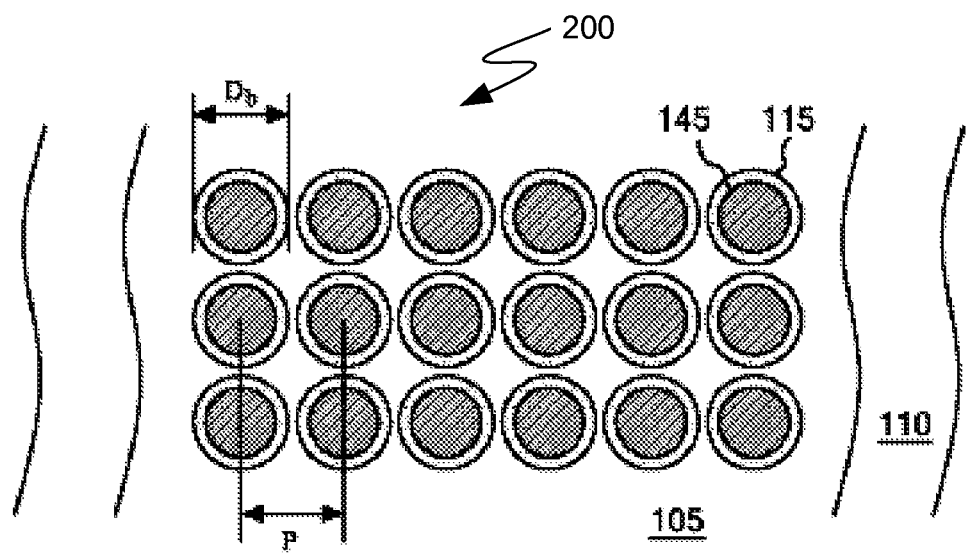
FIG. 3A is a top view of an arrangement of bumps and pillars in the flip-chip interconnect of a chip mounting structure in an embodiment of the present invention.

FIG. 3A is a top view of the arrangement of bumps 115 and pillars 120 in the flip-chip interconnect of the chip mounting structure 200 in an embodiment of the present invention in which the chip 125 has been omitted. In FIG. 3A, the pads 145 of the chip 125 appear on pillars 120. The pitch P of the bumps 115 shown in FIG. 3A is narrower than the pitch P of the bumps 115 shown in FIG. 1A even though the diameter Db of the bumps 115 is the same.

Figure 3B:
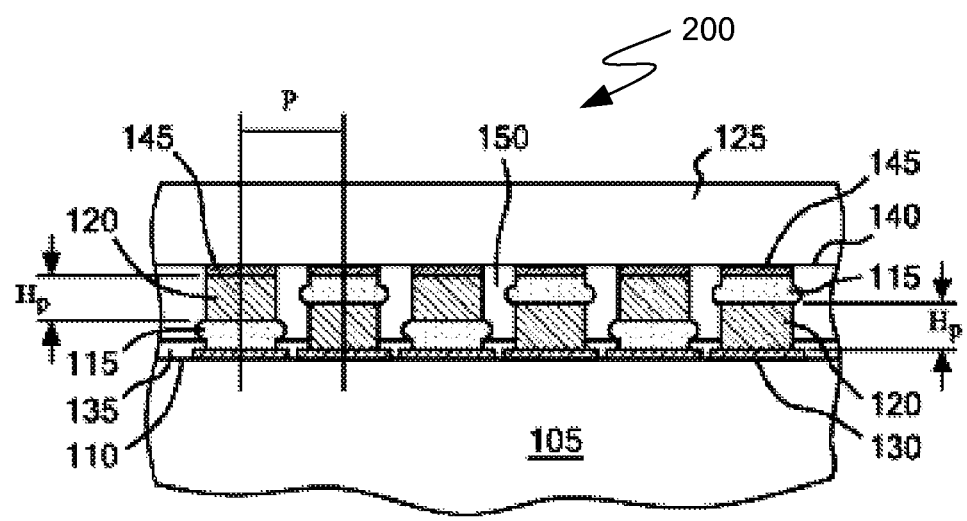
FIG. 3B is a cross-sectional side view of a chip mounting structure in an embodiment of the present invention.

In the top view shown in FIG. 3A, the bumps 115 appear to come into contact with each other. However, in actuality, as shown in the cross-sectional side view of the chip mounting structure 200 in FIG. 3B, the bumps 115 do not come into contact with each other at all. In the chip mounting structure 200, as shown in FIG. 3B, the height positions of adjacent bumps 115 from the connection surface 140 of the chip 125 or from the connection surface 110 of the board 105 have a difference in height exceeding the thickness of the bumps 115. The height position of a bump is the distance along the Z-axis between the position of the bump and the connection surface to which the bump is indirectly connected via a pillar. The thickness of a bump is measured along the Z-axis. As a result, contact does not occur in the chip mounting structure 200 between the bulging central portion of a bump 115 and the bulging central portion of an adjacent bump 115.

A structure in which the height positions of adjacent bumps 115 have a height difference exceeding the thickness of the bumps 115 can be achieved in the following way. A pillar 120 of a predetermined height $H_p$, where $H_p$ is greater than the thickness of the bumps 115 is arranged on the connection surface 140 of the chip 125 at every other flip-chip interconnect position (e.g., at odd-numbered positions), and a bump 115 is placed on each pillar 120. In such an embodiment, a pillar 120 of the same predetermined height $H_p$ is arranged on the connection surface 110 of the board 105 at every other flip-chip interconnect position different from those on the connection surface 140 of the chip 125 (e.g., at even-numbered positions), and a bump 115 is placed on each pillar 120.

A structure in which the height positions of adjacent bumps 115 have a difference in height exceeding the thickness of the bumps 115 can also be achieved in the following way. A pillar 120 of a predetermined height $H_p$, where $H_p$ is greater than the thickness of a bump 115, is arranged on the connection surface 140 of the chip 125 at every other flip-chip interconnect position, such as at the odd-numbered positions 1, 3 and 5 from the left. Also, a pillar 120 of the same predetermined height $H_p$ is arranged on the connection surface 110 of the board 105 at every other flip-chip interconnect position different from those on the connection surface 140 of the chip 125, such as at the even-numbered positions 2, 4 and 6 from the left. A bump 115 is placed on each pillar 120 arranged on connection surface 110. In one embodiment, a bump 115 is also placed on connection surface 110 at flip-chip interconnect positions between pillars 120. In another embodiment, a bump 115 is placed on each pillar 120 arranged on connection surface 140 and a bump 115 is also placed on connection surface 140 at flip-chip interconnect positions between pillars 120.

Figure 4:
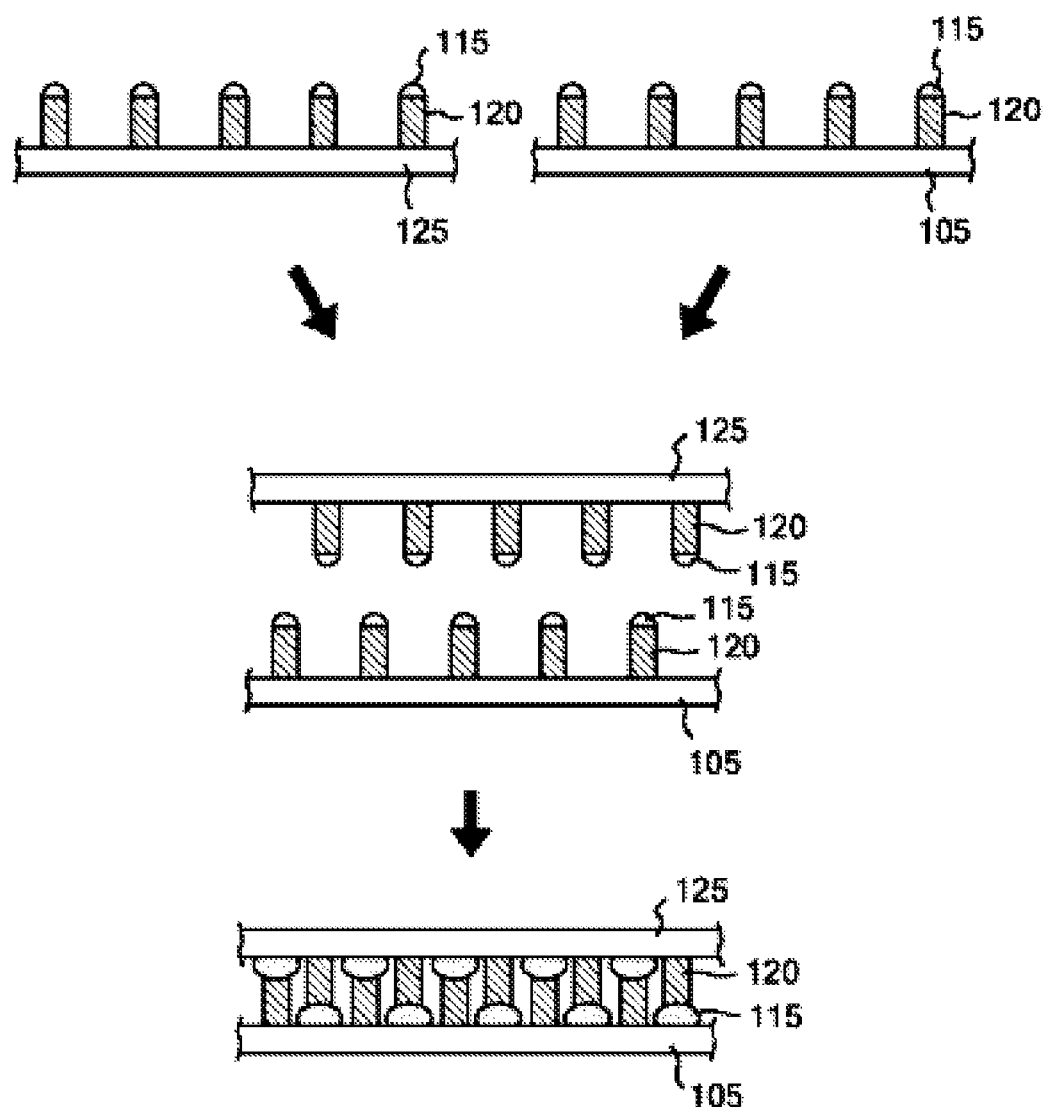
FIG. 4 is a cross-sectional side view of a manufacturing method for the chip mounting structure in an embodiment of the present invention.

FIG. 4 is a cross-sectional side view of a manufacturing method for the chip mounting structure 200 in an embodiment of the present invention. First, as shown in the upper left, pillars 120 of a predetermined height $H_p$, where $H_p$ is greater than the thickness of the bumps 115 are arranged on the connection surface 140 of the chip 125 at every other flip-chip interconnect position, such as at the odd-numbered positions 1, 3 and 5 from the left, and a bump 115 is formed on each pillar 120 formed on the connection surface 140 of the chip 125. Also, as shown in the upper right, pillars 120 of the same predetermined height $H_p$ are arranged on the connection surface 110 of the board 105 at every other flip-chip interconnect position different from those on the connection surface 140 of the chip 125, such as at the even-numbered positions 2, 4 and 6 from the left, and a bump 115 is provided on each pillar 120 formed on the connection surface 110 of the board 105.

Next, as shown in the middle of FIG. 4, the bumps 115 formed on pillars 120 on the connection surface 140 of the chip 125 are connected at flip-chip interconnect positions on the connection surface 110 of the board 105 not including a bump 115, and the bumps 115 formed on pillars 120 on the connection surface 110 of the board 105 are connected at flip-chip interconnect positions on the connection surface 140 of the chip 125 not including a bump 115. In this way, as shown in the lower level of the drawing, a chip mounting structure 200 is obtained in which the height positions of adjacent bumps 115 have a difference in height exceeding the thickness of the bumps 115.

In this manufacturing method, the formation of bumps 115 is facilitated by the formation of pillars 120 at every other flip-chip interconnect position on both the connection surface 140 of the chip 125 and on the connection surface 110 of the board 105, and bumps 115 are formed on top of the pillars 120. However, when the pitch P between the bumps 115 is too narrow, it becomes difficult to align the bumps 115 on top of the pillars 120 of the predetermined height $H_p$ on both the connection surface 140 of the chip 125 and the connection surface 110 of the board 105 in the horizontal directions. When the chip 125 is bonded to the board 105, the bumps 115 formed on the pillars 120 of the connection surface 140 of the chip 125 and the bumps 115 formed on the pillars 120 of the connection surface 110 of the board 105 may come into contact with each other and become damaged.

Figure 5:
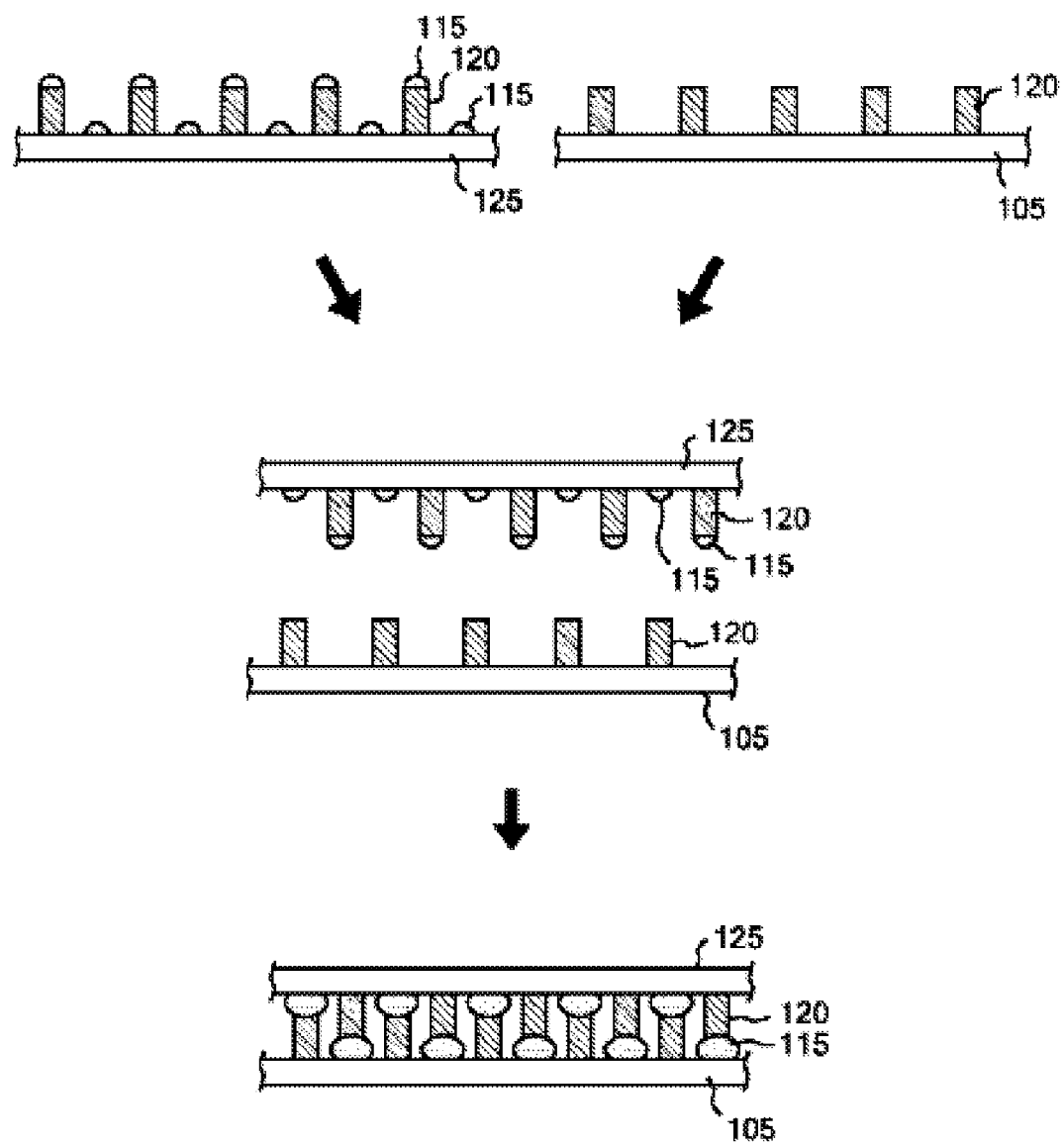
FIG. 5 is a cross-sectional side view of another manufacturing method for the chip mounting structure in an embodiment of the present invention.

FIG. 5 is a cross-sectional side view of another manufacturing method for the chip mounting structure 200 in an embodiment of the present invention. First, as shown in the upper left, pillars 120 of a predetermined height $H_p$, where $H_p$ is greater than the thickness of the bumps 115 are arranged on the connection surface 140 of the chip 125 at every other flip-chip interconnect position, such as at the odd-numbered positions 1, 3 and 5 from the left, and a bump 115 is formed on each pillar 120 of connection surface 140 of the chip 125 and on connection surface 140 at each flip-chip interconnect position between pillars 120 (e.g., at the even-numbered positions 2, 4 and 6 from the left). Also, as shown in the upper right, pillars 120 of the same predetermined height $H_p$ are arranged on the connection surface 110 of the board 105 at every other flip-chip interconnect position different from those on the connection surface 140 of the chip 125, such as at the even-numbered positions 2, 4 and 6 from the left.

Next, as shown in the middle of FIG. 5, the bumps 115 formed on pillars 120 and at flip-chip interconnect positions between pillars 120 on the connection surface 140 of the chip 125 are connected to pillars 120 and at flip-chip interconnect positions on the connection surface 110 of the board 105 not including a bump 115. In this way, as shown in the lower level of the drawing, a chip mounting structure 200 is obtained in which the height positions of adjacent bumps 115 have a difference in height exceeding the thickness of the bumps 115.

In this manufacturing method, pillars 120 are formed at every other flip-chip interconnect position on the connection surface 140 of the chip 125. Further, bumps 115 are formed on the pillars 120 and at flip-chip interconnect positions between pillars 120. This method facilitates the formation of bumps 115 on the connection surface 140 of the chip 125 and the alignment of the bumps 115 in the horizontal direction. When the chip 125 is joined to the board 105, the pitch P between bumps 115 can be narrowed with little danger that bumps 115 will come into contact with each other and become damaged. However, the process of forming bumps 115 at the flip-chip interconnect positions between pillars 120 on the connection surface 140 of the chip 125 may be more complicated.

Figure 6:
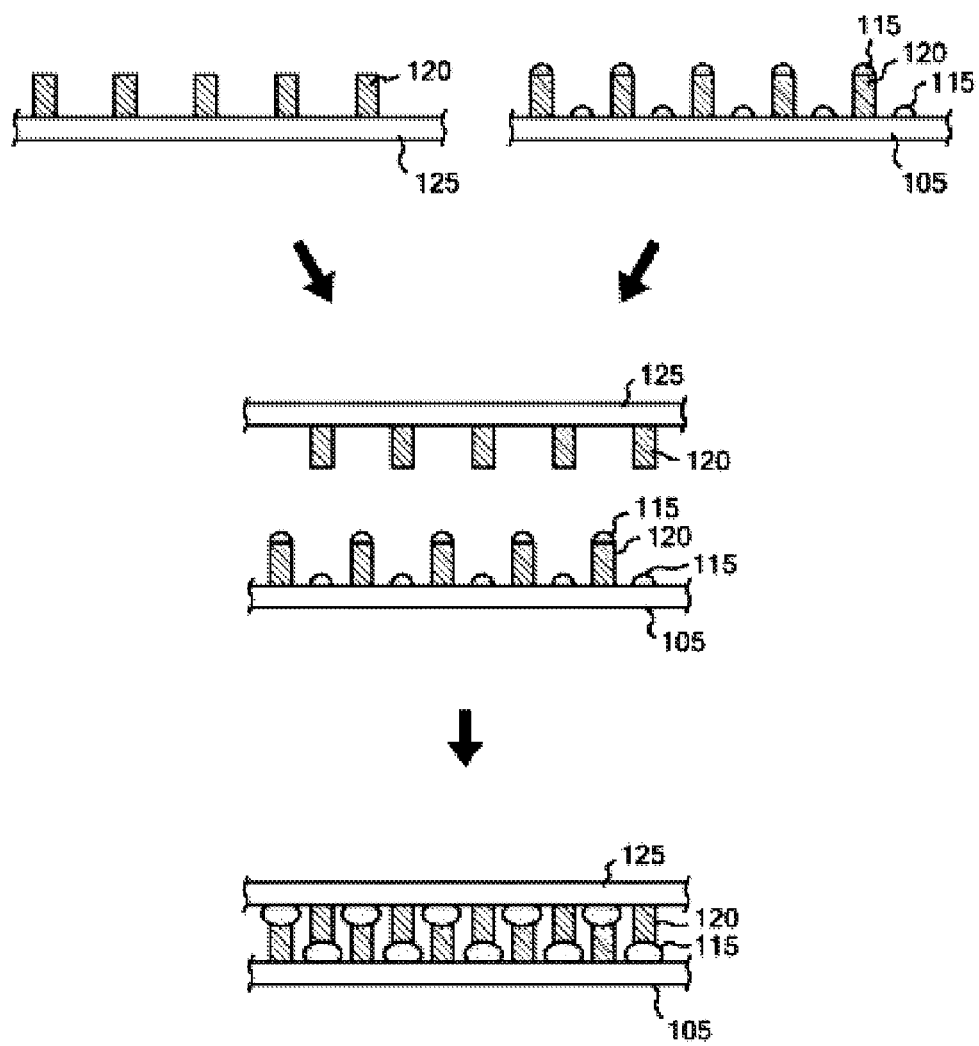
FIG. 6 is a cross-sectional side view of yet another manufacturing method for the chip mounting structure in an embodiment of the present invention.

FIG. 6 is a cross-sectional side view of yet another manufacturing method for the chip mounting structure 200 in an embodiment of the present invention. First, as shown in the upper left, pillars 120 of a predetermined height $H_p$, where $H_p$ is greater than the thickness of the bumps 115 are arranged on the connection surface 140 of the chip 125 at every other flip-chip interconnect position, such as at the odd-numbered positions 1, 3 and 5 from the left. Also, as shown in the upper right of FIG. 6, pillars 120 of the same predetermined height $H_p$ are arranged on the connection surface 110 of the board 105 at every other flip-chip interconnect position different from those on the connection surface 140 of the chip 125, such as at the even-numbered positions 2, 4 and 6 from the left, and a bump 115 is formed on each pillar 120 formed on the connection surface 110 of the board 105 and at each flip-chip interconnect position between pillars 120.

Next, as shown in the middle of FIG. 6, the bumps 115 formed on pillars 120 and at flip-chip interconnect positions between pillars 120 on the connection surface 110 of the board 105 are connected to pillars 120 and at flip-chip interconnect positions on the connection surface 140 of the chip 125 not including a bump 115. In this way, as shown in the lower level of the drawing, a chip mounting structure 200 is obtained in which the height positions of adjacent bumps 115 have a difference in height exceeding the thickness of the bumps 115.

In this manufacturing method, pillars 120 are formed at every other flip-chip interconnect position on the connection surface 110 of the board 105 and at flip-chip interconnect positions between pillars 120. As a result, the formation of bumps 115 only on the connection surface 110 of the board 105 and the alignment of the bumps 115 in the horizontal direction are relatively easy. When the chip 125 is joined to the board 105, the pitch P between bumps 115 can be narrowed with little danger that bumps 115 will come into contact with each other and become damaged. However, because bumps 115 are also formed at the flip-chip interconnect positions between pillars 120 on the connection surface 110 of the board 105, the process of forming bumps 115 on the connection surface 110 of the board 105 is complicated.

Figure 7A:
FIG. 7A-FIG. 7G are cross-sectional side views of the main steps in a manufacturing method for the chip mounting structure in an embodiment of the present invention.
Figure 7B:
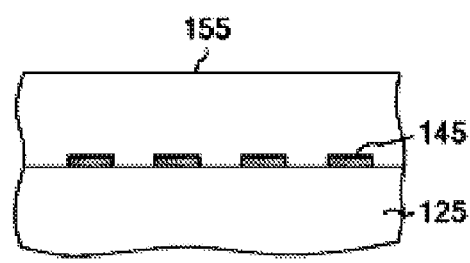

FIG. 7A-FIG. 7G are cross-sectional side views of the main steps in a manufacturing method for the chip mounting structure in an embodiment of the present invention. The process shown in FIG. 7A-FIG. 7G is performed by the manufacturing method shown in FIG. 4. In FIG. 7A, pads 145 are provided on the connection surface 140 of the chip 125. These pads 145 may be provided by forming a dielectric layer on the connection surface 140 of the chip 125, exposing and developing the surface using a mask, forming holes in the dielectric layer, forming a second dielectric layer on top of the first dielectric layer and inside the holes, and then removing the first dielectric layer from the connection surface 140 so as to leave the second dielectric layer formed inside the holes. FIG. 7B, a first resistor 155 is applied to the connection surface 140 of the chip 125.

Figure 7C:
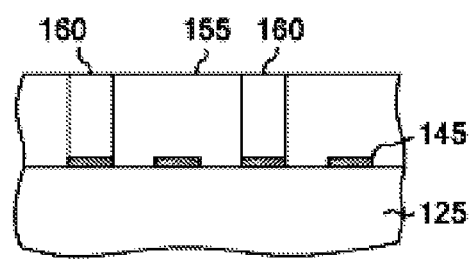
Figure 7D:
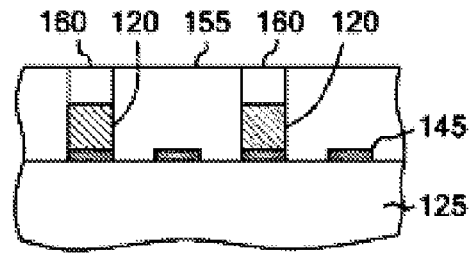
Figure 7E:
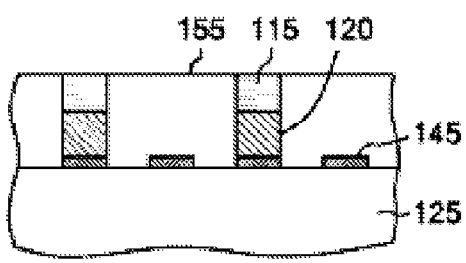
Figure 7F:
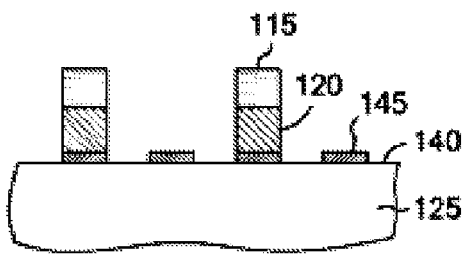
Figure 7G:
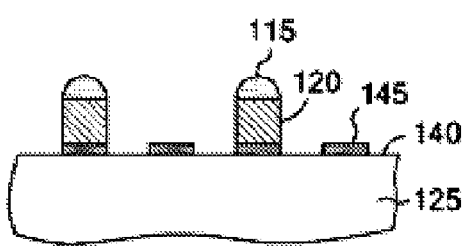

In FIG. 7C, first holes 160 are opened in the first resistor 155 to reach the connection surface 140 of the chip 125 by exposing and developing the resistor using a mask at the positions where pillars 120 are to be formed. In FIG. 7D, pillars 120 of a predetermined height $H_p$ are formed in the first holes 160 opened in the first resistor 155 using, for example, copper plating. In FIG. 7E, bumps 115 are formed on the pillars 120 in the first holes 160 opened in the first resistor 155 using, for example, solder plating. In FIG. 7F, the first resistor 155 is removed from the connection surface 140 of the chip 125. In FIG. 7G, the bumps 115 are trimmed so as to be rounded.

In FIG. 7A-FIG. 7G, pillars 120 are formed on the connection surface 140 of the chip 125, and bumps 115 are formed on the pillars 120. However, pillars 120 can be formed on the connection surface 110 of the board 105, and bumps 115 can be formed on the pillars 120 in the same manner. In this case, pads 130 are provided on the connection surface 110 of the board 105; a second resistor similar to the first resistor 155 is applied to the connection surface 110 of the board 105; and second holes similar to the first holes 160 are opened in the second resistor to reach the connection surface 110 of the board 105.

Figure 8A:
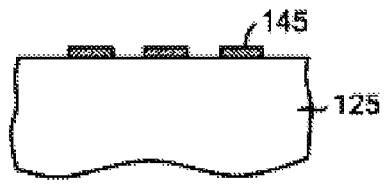
FIG. 8A-FIG. 8J are a cross-sectional side views of the main steps in another manufacturing method for the chip mounting structure in an embodiment of the present invention.
Figure 8B:
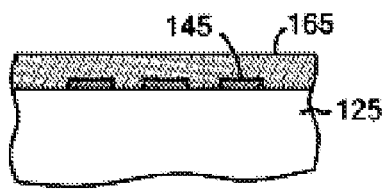
Figure 8G:
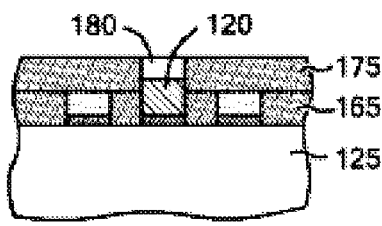
Figure 8C:
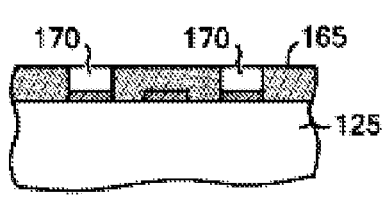
Figure 8H:
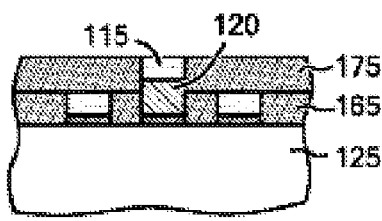
Figure 8D:
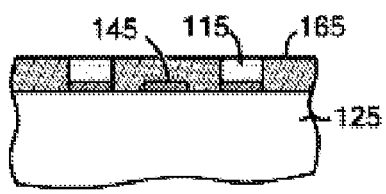

FIG. 8A-FIG. 8J are cross-sectional side views of the main steps in another manufacturing method for the chip mounting structure in an embodiment of the present invention. The process shown in FIG. 8A-FIG. 8J is performed by the manufacturing method shown in FIG. 5. In FIG. 8A, as in FIG. 7A-FIG. 7G, pads 145 are provided on the connection surface 140 of the chip 125. In FIG. 8B, as in FIG. 7A-FIG. 7G, a first resistor 165 is applied to the connection surface 140 of the chip 125. Because holes are opened in the first resistor 165 for the formation of bumps 115, the thickness of the first resistor 165 does not have to be as thick as the first resistor 155 in FIG. 7B which was used to form pillars 120 of a predetermined height $H_p$. In FIG. 8C, first holes 170 are opened in the first resistor 165 to reach the connection surface 140 of the chip 125 by exposing and developing the resistor using a mask at the positions where bumps 115 are to be formed. In FIG. 8D, bumps 115 are formed in the first holes 170 opened in the first resistor 165 using, for example, solder plating.

Figure 8I:
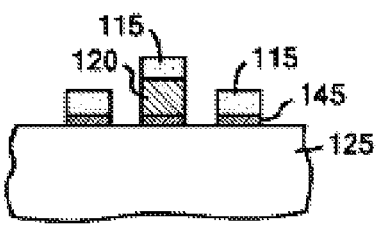
Figure 8E:
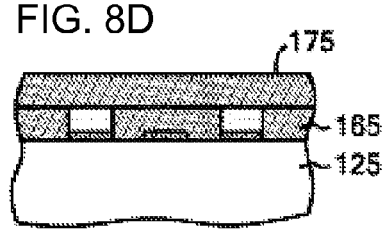
Figure 8J:
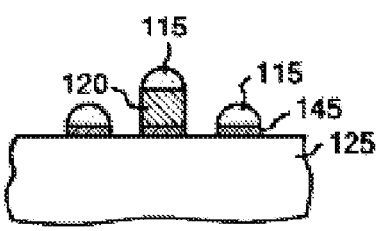
Figure 8F:
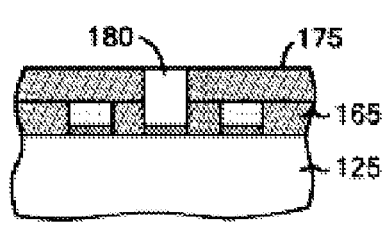

In FIG. 8E, a second resistor 175 is applied to the first resistor 165. In FIG. 8F, second holes 180 are opened in the second resistor 175 and in the first resistor 165 to reach the connection surface 140 of the chip 125 at the positions where pillars 120 are to be formed by exposing and developing the resistors using a mask. In FIG. 8G, pillars 120 of a predetermined height $H_p$ are formed in the second holes 180 that is opened in the second resistor 175 and in the first resistor 165 using, for example, copper plating. In FIG. 8H, bumps 115 are formed on the pillars 120 in the second holes 180, which are opened in the second resistor 175 and in the first resistor 165 using, for example, solder plating. In FIG. 8I, the second resistor 175 and first resistor 165 are removed from the connection surface 140 of the chip 125. In FIG. 8J, the bumps 115 are trimmed so as to be rounded.

In FIG. 8A-FIG. 8J, pillars 120 are formed on the connection surface 140 of the chip 125, bumps 115 are formed on the pillars 120, and additional bumps 115 are formed at the flip-chip interconnect positions between pillars 120. Also, pillars 120 of a predetermined height $H_p$ are not formed on the connection surface 110 of the opposing board 105 joined to the chip. The process from FIG. 7A to FIG. 7D may simply be performed on the connection surface 110 of the board 105 with the first resistor 155 removed, in which case pillars 120 are formed only on the connection surface 110 of the board 105.

In FIG. 8A-FIG. 8J, pillars 120 are formed on the connection surface 140 of the chip 125, bumps 115 are formed on the pillars 120, and additional bumps 115 are formed at the flip-chip interconnect positions between pillars 120. However, the manufacturing method shown in FIG. 6 may also be used to form pillars 120 on the connection surface 110 of the board 105, form bumps 115 on the pillars 120, and form additional bumps 115 at the flip-chip interconnect positions between pillars 120. In this case, pads 130 are formed on the connection surface 110 of the substrate 105 and the same process is performed on the connection surface 110 of the substrate 105.

Figure 9:
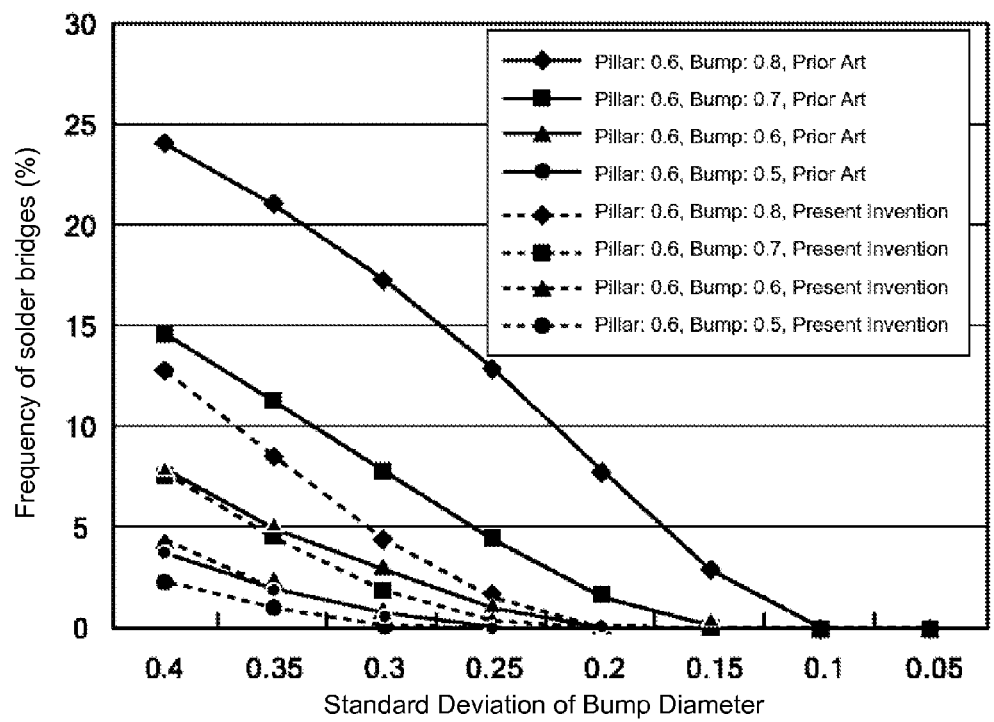
FIG. 9 is a graph comparing the calculated frequency of solder bridges in flip-chip connections of the prior art and the present invention.

FIG. 9 is a graph comparing the calculated frequency of solder bridges in flip-chip connections of the prior art and the present invention. The frequency of solder bridges was calculated using a bump pitch of 1 (reference value), a pillar diameter of 0.6, and bump diameters ranging from 0.5 to 0.8 (at 0.1 increments). Here, the standard deviation value for the bump diameter was changed from 0.05 to 0.4 (at 0.05 increments). The calculations are displayed in the graph. On the graph, the vertical axis indicates the frequency of solder bridges, and the horizontal axis indicates the standard deviation of the bump diameter. There is a high frequency of solder bridges at the flip-chip interconnects of the prior art which are arranged in the X-direction and the Y-direction on a two-dimensional plane. However, there is a lower frequency of solder bridges at the flip-chip interconnects of the present invention which are arranged in the X-direction, Y-direction and the Z-direction in three-dimensional space. When the bump diameter is 0.8 and the standard deviation of the bump diameter is 0.4, the frequency of solder bridges at flip-chip interconnects of the prior art is approximately 24%, while the frequency of solder bridges at flip-chip interconnects of the present invention is approximately 13%, which is a reduction of nearly 50%.

Figure 10:
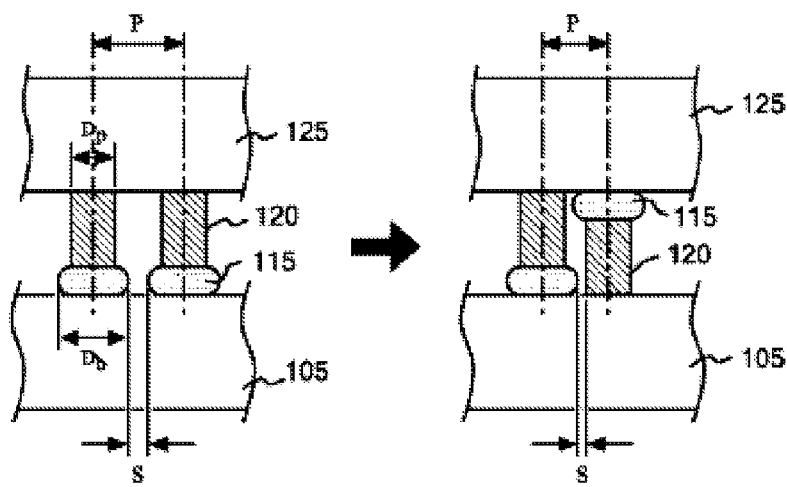
FIG. 10 is a side view comparing the bump pitches of the flip-chip connections of the prior art and the present invention when the frequency of solder bridges was calculated.

FIG. 10 is a side view comparing the bump pitches of the flip-chip connections of the prior art and of the present invention when the frequency of solder bridges was calculated. In FIG. 9, the frequencies of solder bridges at the flip-chip interconnects of the prior art and the present invention were calculated with the bump pitch held constant. The frequency of solder bridges at the flip-chip interconnects was held constant in order to determine what happens when the bump pitch is narrowed at the flip-chip interconnects of the prior art and present invention. The space S between bumps had to be set at the flip-chip interconnects of the prior art shown on the left in FIG. 10. Here, the frequency of solder bridges per module was 1.0% when the bump pitch P was 1.0, the bump diameter Db was 0.7, the bump diameter standard deviation was 0.1091, the pillar diameter $D_p$ was 0.6, and the number of bumps per module was 200.

The space S between bumps and pillars was set to the same value at the flip-chip interconnects of the present invention shown on the right in FIG. 10. Here, the frequency of solder bridges per module was 1.0% when the bump pitch P was 0.871 and the rest of the values were the same: a bump diameter $D_b$ of 0.7, a bump diameter standard deviation of 0.1091, a pillar diameter $D_p$ of 0.6, and a number of bumps per module of 200. Therefore, even when the frequency of solder bridges was the same at 1.0%, the bump pitch P at the flip-chip interconnects of the present invention had been reduced from 1.0 to 0.871, which is a narrowing of approximately 13%. When adjusted to the number of input/outputs (IOs) per unit area on the connection surfaces of the chip 125 and the board 105, $(1/0.871)^2=1.3178$. In other words, the number of IOs can be increased by approximately 32%.

The present invention was explained above using an embodiment, but the technical scope of the present invention is not limited to the embodiment described above. Many modifications and improvements to this embodiment should be apparent to those skilled in the art and any embodiments including these modifications and improvements are clearly within the technical scope of the present invention.

What is claimed is:

1. A chip mounting structure establishing a flip-chip interconnect between a chip and a board via a plurality of bumps, the structure comprising:
    a first bump of the plurality of bumps formed at a first distance from the chip; and
    a second bump of the plurality of bumps formed at a second distance from the board, wherein the first bump is adjacent to the second bump,
    a first set of pillars arranged on a connection surface of the chip at first alternating flip-chip interconnect positions of the chip, wherein a first bump is on each of the first set of pillars and each of the first set of pillars is of a predetermined height that is greater than each of a thickness of the first bump and a thickness of the second bump;
    a second set of pillars arranged on a connection surface of the board at second alternating flip-chip interconnect positions of the board different from those on the connection surface of the chip atwhich the first set of pillars is arranged, wherein a second bump is on each of the second set of pillars and each of the second set of pillars is of a predetermined height that is greater than each of a thickness of the first bump and a thickness of the second bump;
    wherein each first bump of the plurality of bumps is formed on the connection surface of the board at flip-chip interconnect positions not occupied by the second set of pillars; and
    each second bump of the plurality of bumps is formed on the connection surface of the chip at flip-chip interconnect positions not occupied by the first set of pillars, and each second bump is on a same plane as a first end of each of the first pillars and a second end of each first pillar is connected to a first bump.

2. The chip mounting structure of claim 1, wherein the first set of pillars are arranged at even interconnect positions of the chip and wherein the second set of pillars are arranged at odd interconnect positions of the board.

3. A method for manufacturing a chip mounting structure, the method comprising:
    forming a first set of pillars on the connection surface of the chip at every other flip-chip interconnect position of the connection surface, wherein each of the first set of pillars is of a predetermined height;
    forming first bumps on the first set of pillars, wherein the predetermined height is greater than a thickness of the first bumps;
    forming a second set of pillars of the predetermined height on the connection surface of a board at every other flip-chip interconnect position different from those on the connection surface of the chip at which the first set of pillars is arranged;
    forming second bumps on the second set of pillars, wherein the predetermined height is greater than a thickness of the first and second bumps;
    connecting the first bumps of the first set of pillars to the connection surface of the board at flip-chip interconnect positions not occupied by the second set of pillars, and
    connecting the second bumps formed on the second set of pillars to the connection surface of the chip at flip-chip interconnect positions not occupied by the first set of pillars, wherein each second bump is on a same plane as a first end of each of the first pillars and a second end of each first pillar is connected to a first bump.

4. The method of claim 3, further comprising:
    forming a bump on the connection surface of the chip at flip-chip interconnect positions not occupied by the first set of pillars.

5. The method of claim 3:
    wherein forming a first pillar of the first set of pillars and a bump on the first pillar further comprises:
        applying a first resistor to the connection surface of the chip;
        opening a first hole in the first resistor to the connection surface of the chip, wherein the first hole is at the first pillar formation position; and
        forming the first pillar in the first hole;
        forming the bump on the first pillar; and
        removing the first resistor;
    wherein forming a second pillar of the second set of pillars and a bump on the second pillar further comprises:
        applying a second resistor to the connection surface of the board;
        opening a second hole in the second resistor to reach the connection surface of the board, wherein the hold is at each pillar formation position;
        forming the second pillar in the second hole;
        forming the bump on the second pillar; and
        removing the second resistor.

6. A method for manufacturing a chip mounting structure, the method comprising:
    forming a first set of pillars on the connection surface of the chip at every other flip-chip interconnect position of the connection surface, wherein each of the first set of pillars is of a predetermined height;
    forming a second set of pillars of the predetermined height on the connection surface of a board at every other flip-chip interconnect position different from those on the connection surface of the chip at which the first set of pillars is arranged;
    forming second bumps on the second set of pillars;
    forming first bumps on the connection surface of the board at flip-chip interconnect positions not occupied by the second set of pillars, wherein the predetermined height is greater than a thickness of both first and second bumps;
    connecting the second bumps formed on the second set of pillars to the connection surface of the chip at flip-chip interconnect positions not occupied by the first set of pillars; and
    connecting the first bumps formed on the connection surface of the board to pillars of the first set of pillars, wherein each second bump is on a same plane as a first end of each of the first pillars and a second end of each first pillar is connected to a first bump.

7. The method of claim 6:
wherein forming a first pillar of the first set of pillars and a bump on the first pillar further comprises:
  applying a first resistor to the connection surface of the chip;
  opening a first hole in the first resistor to the connection surface of the chip, wherein the first hole is at the first pillar formation position; and
  forming the first pillar in the first hole;
  forming the bump on the first pillar; and
  removing the first resistor;
wherein forming a second pillar of the second set of pillars and a bump on the second pillar further comprises:
  applying a second resistor to the connection surface of the board;
  opening a second hole in the second resistor to reach the connection surface of the board, wherein the hold is at each pillar formation position;
  forming the second pillar in the second hole;
  forming the bump on the second pillar; and removing the second resistor.

* * * * *